United States Patent
Czaja et al.

[19]

[11] Patent Number: 5,911,785
[45] Date of Patent: Jun. 15, 1999

[54] TEST FIXTURE AND METHOD OF TESTING A SPIN RINSE DRYER AND COMPONENTS THEREOF

[75] Inventors: Douglas A. Czaja; Robert Bolanos, both of San Antonio, Tex.

[73] Assignees: Sony Corporation, Tokyo, Japan; Sony Electronics Inc., Park Ridge, N.J.

[21] Appl. No.: 08/992,130

[22] Filed: Dec. 17, 1997

[51] Int. Cl.[6] ................................................. G01M 19/00
[52] U.S. Cl. ............................................ 73/168; 73/865.9
[58] Field of Search .................................. 73/168, 865.9, 73/865.8

[56] References Cited

U.S. PATENT DOCUMENTS

| | | | |
|---|---|---|---|
| 3,731,520 | 5/1973 | Hickman et al. | 73/73 |
| 4,088,017 | 5/1978 | Olges | 73/168 |
| 4,481,781 | 11/1984 | Bashark | 62/160 |
| 5,200,684 | 4/1993 | Fisher | 318/809 |
| 5,497,563 | 3/1996 | Mayfield | 34/572 |

OTHER PUBLICATIONS

Declaration of Raymond R. Rayniak, dated Sep. 1, 1998.

*Primary Examiner*—Max H. Noori
*Attorney, Agent, or Firm*—Wood, Herron & Evans, L.L.P.

[57] ABSTRACT

A test fixture and method emulate the inputs and/or outputs to a controller and motor of a spin rinse dryer to permit selective testing of the controller and/or motor thereof. In some instances, the test fixture enables testing of a spin rinse dryer controller and/or motor to be performed outside of a clean room environment, and without requiring a spin rinse dryer to be taken off-line. In other instances, the same test fixture enables diagnosis of which component if any has failed in a production spin rinse dryer so that the failed component can be replaced quickly to minimize the downtime of the equipment.

16 Claims, 3 Drawing Sheets

TEST FIXTURE AND METHOD OF TESTING A SPIN RINSE DRYER AND COMPONENTS THEREOF

FIELD OF THE INVENTION

The invention is generally directed to testing and diagnosis of semiconductor processing equipment. In particular, the invention is generally directed to a test fixture and method for testing of a spin rinse dryer and components thereof.

BACKGROUND OF THE INVENTION

Equipment down time is a significant concern in many semiconductor processing facilities. In particular, the period in which any production equipment in a semiconductor fabrication line is off-line may, in effect, shut down the entire line, or in the least, reduce the productivity and output of the line. Accordingly, it is desirable to minimize the down time of any production equipment to the fullest extent possible.

Semiconductor processing equipment, like all industrial equipment, is prone to periodic failures of individual components within the equipment. It is customary to maintain spare parts for major components of semiconductor processing equipment such that failed components can quickly be swapped out with a working spare component to minimize the down time of the equipment. The failed component is later repaired, if possible, and kept as a spare component for use when other such components later fail.

For example, one such type semiconductor processing equipment is a spin rinse dryer, which is used to clean semiconductor wafers after various stages of processing. As a result of the numerous processing steps associated with forming semiconductors on wafers, spin rinse dryers are used at a number of points in the process. In many facilities, tens of spin rinse dryers may be in operation at any given time.

A spin rinse dryer typically includes a carousel that houses a number of semiconductor wafers. The carousel is coupled to a high speed motor that rotates the carousel at different controlled rates. The carousel is mounted within a sealed chamber, and a heater, a vacuum source, and source of pressurized gas such as nitrogen are provided in the chamber to provide a controlled atmosphere. A dedicated controller maintains control over the carousel motor as well as various solenoids that activate the heater and sources in the chamber.

During various phases of operation, de-ionized water is sprayed on the wafers while the carousel is rotated (typically at about 400 RPM). Next, the rotational speed of the carousel is increased to 1800 RPM or more to dry the wafers via centrifugal force. Next, the rotational speed of the carousel is decreased (typically to about 600 RPM) prior to completion of the process. During each phase, a controlled, heated, inert atmosphere (e.g., of nitrogen gas) is maintained in the chamber to minimize any undesirable chemical reactions on the wafers.

As with most equipment, components such as the controller, the motor, and various cables on a spin rinse dryer are prone to periodic failure. For these reasons, spare components are typically kept on hand for swapping out failed components from time to time. However, swapping out such components typically requires the equipment to be taken off-line. Moreover, spin rinse dryers are typically located in temperature and humidity controlled clean room environments that require technicians to suit up in appropriate clean room attire to perform the maintenance procedure.

Often the repair of a failed component does not need to be performed within the clean room environment, but may be performed in a technician's shop. However, typically the only manner of testing a repaired component is to put the component back in the production equipment, whether immediately after repair or at such time that another component fails. However, reinstalling a repaired component in production equipment requires suiting up for the clean room environment and taking the equipment off-line, both of which decrease productivity and are unduly burdensome to technicians. In addition, there is a risk that an incorrectly-repaired component could damage the production equipment.

Therefore, a significant need exists for a versatile manner of testing various components in a spin rinse dryer such that equipment downtime is minimized and technician productivity is maximized.

SUMMARY OF THE INVENTION

The invention addresses these and other problems associated with the prior art in providing a test fixture and method that emulate the inputs and/or outputs to the controller and motor of a spin rinse dryer to permit selective testing of the controller and/or motor thereof. In some instances, the test fixture enables testing of a spin rinse dryer controller and/or motor to be performed outside of a clean room environment, and without requiring a spin rinse dryer to be taken off-line. In other instances, the same test fixture enables diagnosis of which component if any has failed in a production spin rinse dryer so that the failed component can be replaced quickly to minimize the downtime of the equipment.

A test fixture consistent with the invention may include a plurality of indicators mounted on a housing and coupled to a first connector to receive a plurality of component actuation signals from the controller such that the plurality of indicators respectively emulate a plurality of electrically-actuated components on the spin rinse dryer. In addition, a second connector may removably couple with a connector on a motor to transmit a motor actuation signal between the controller and the motor.

A method of testing a spin rinse dryer consistent with the invention may include electrically and removably coupling first and second connectors on a test fixture to a controller and a motor, respectively, with a plurality of indicators on the test fixture respectively configured to receive a plurality of component actuation signals from the controller and thereby emulate the plurality of electrically-actuated components. Once coupled, a control cycle for the controller may be initiated such that the motor and the plurality of indicators may be monitored to verify proper operation of the controller.

These and other advantages and features, which characterize the invention, are set forth in the claims annexed hereto and forming a further part hereof. However, for a better understanding of the invention, and of the advantages and objectives attained through its use, reference should be made to the Drawing, and to the accompanying descriptive matter, in which there is described exemplary embodiments of the invention.

DETAILED DESCRIPTION

Figure 1:
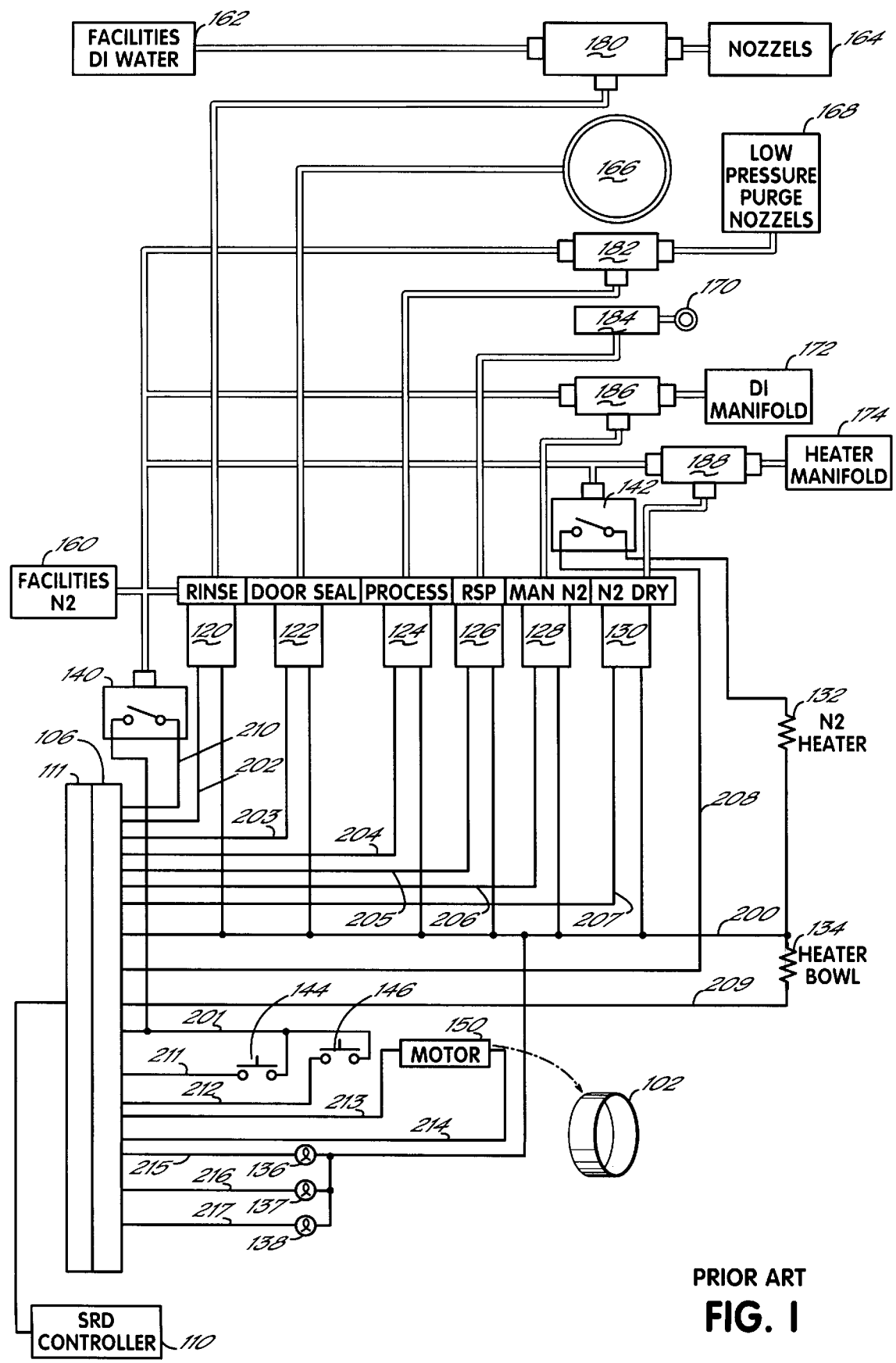
FIG. 1 is a block diagram of a conventional spin rinse dryer.

Turning to the Drawing, wherein like numbers denote like parts throughout the several views, FIG. 1 shows a spin rinse dryer (SRD) 100 which is of the type suitable for testing with a test fixture consistent with the invention. Spin rinse dryer 100 may be any of a number of commercially-available models, e.g., the Semitool ST260 spin rinse dryer, or other designs available from Semitool and VTI, among others.

Spin rinse dryer 100 includes a plurality of electrically-actuated components. For example, as shown in FIG. 1, various components in an SRD stack may be controlled by controller 110 through a pair of mating connectors 111, 106 and control lines 200–217, including a rinse valve 120, a door seal valve 122, a process valve 124, a rotational stop positioner valve 126, a manifold N2 valve 128, an N2 dry valve 130, an N2 heater element 132, a heater bowl element 134, a system power lamp 136, a door seal lamp 137 and a heater lamp 138. Input is received by controller 110 from an N2 supply switch 140, a heater cut-off switch 142, a start switch 144 and a stop switch 146. In addition, a motor 150 is coupled to controller 110 to rotate a carousel 102 within which a plurality of semiconductor wafers are housed.

A neutral (ground) signal is provided at line 200, and a fused hot 115V signal is provided at line 201. Each of valves 120–130 are typically Humphrey valves mounted in an N2 manifold 104 that are coupled to a source of pressure, e.g., a source of pressurized nitrogen gas (facilities N2 supply 162). In response to an appropriate electrical signal from controller 110, each valve pressurizes a control line for performing a predetermined action in the spin rinse dryer. For example, valve 120 pressurizes a control line to an air valve 180 in response to a RINSE control signal 202 from controller 110 to direct deionized (DI) water from a source of deionized water (facilities DI water supply 162) to nozzles 164. Valve 122 pressurizes a door seal 166 in response to a DOOR control signal 203. Valve 124 pressurizes a control line to an air valve 182 in response to a PROCESS control signal 204 to direct pressurized nitrogen gas (N2) from supply 160 to low pressure purge nozzles 168 so that a positive pressure is maintained in the spin rinse dryer at all times. Valve 126 pressurizes a rotational stop positioner actuator 184 in response to an RSP control signal 205 to extend a piston 170 and upright carousel 102. Valve 128 pressurizes a control line to an air valve 186 in response to a MANIFOLD PURGE control signal 206 to direct nitrogen gas from supply 160 to DI manifold 172 to flush any DI water from the manifold. Valve 130 pressurizes a control line to an air valve 188 in response to an N2 DRY control signal 207 to direct nitrogen gas from supply 160 to heater manifold 174.

N2 heater element 132 and heater bowl element 134 are heater elements that are respectively activated by HEATER N2 and HEATER BOWL control signals 208, 209. Moreover, heater cut-off switch 142 is coupled in series with N2 heater element 132 to shut off element 132 when no nitrogen supply pressure is detected in the supply line to heater manifold 174. Lamps 136–138 are typically neon lamps that receive SYSTEM POWER, DOOR SEAL LAMP, and HEATER LAMP control signals 215, 216 and 217, respectively, although other forms of indicators may be used in the alternative.

N2 supply switch 140 is a normally-open pressure switch that generates an N2 SUPPLY signal 210 to controller 110 whenever at least a predetermined pressure of nitrogen gas is present in the nitrogen supply line. Start and stop switches 144, 146 are typically normally-open momentary switches that are used to generate START and STOP control signals 211, 212 to start and stop cycling of the spin rinse dryer controller.

Controller 110 may be any number of commercially-available spin rinse dryer controllers, such as various models available from Semitool, VTI, and RTech among others (e.g., the Semitool P328 controller). The pin-outs for the controller are illustrated in greater detail in FIG. 3. Motor 150 is typically a DC motor such as is available from Scientific Pacific and Semitool, among others, and is coupled to controller 110 through MOTOR+ and MOTOR− acontrol signals 213, 214.

It should be appreciated that the general operation and configuration of spin rinse dryer 100 and its various components are well known in the art. Moreover, it should be appreciated that other spin rinse dryer designs may be used in the alternative.

Figure 2:
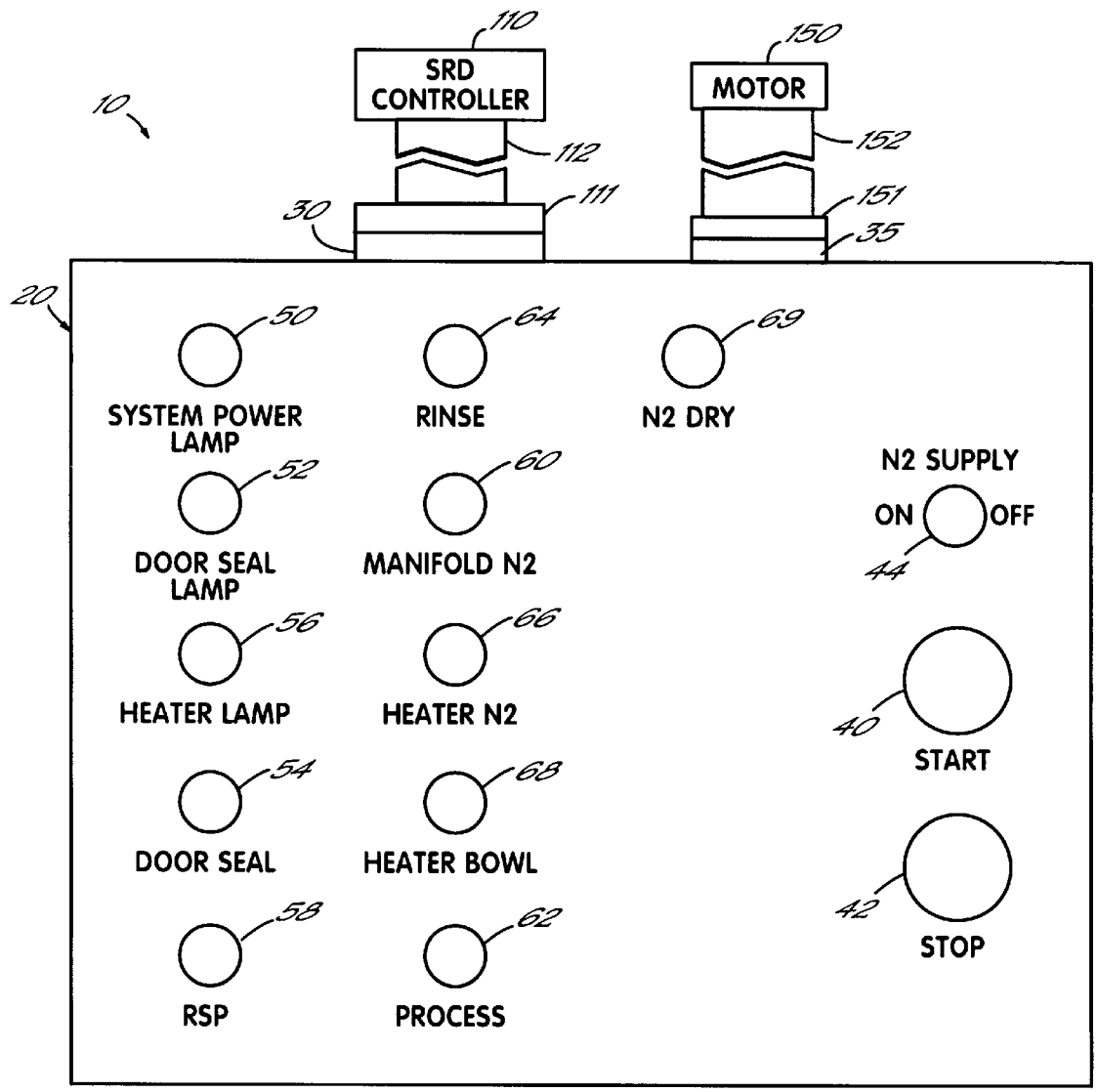
FIG. 2 is a block diagram of a test fixture consistent with the principles of the invention, shown coupled to various components of a spin rinse dryer through mating connectors.

FIG. 2 illustrates a test fixture 10 consistent with the invention. Test fixture 10 may be utilized to test a spin rinse dryer controller and/or a spin rinse dryer motor, as well as perform some diagnosis of the electrical cabling and connections within a spin rinse dryer. As illustrated in FIG. 2, test fixture 10 includes a housing 20 within which a plurality of indicators, switches and connectors are mounted.

A first connector 30 is mounted on housing 20 to interface with a spin rinse dryer controller 110. Connector 30 is generally configured to mate with a connector 111 that interfaces with controller 110 through a cable 112. Connectors 30 and 111 are typically multi-pin connectors such as the 28 pin MATE-N-LOC connector #205839-3 available from Allied Electronics. Connector 30 is generally configured to emulate an umbilical power cable connector (connector 106 in FIG. 1) which, in the normal operation of the spin rinse dryer, receives connector 111 of controller 110.

A second connector 35 is also mounted within housing 20 for interfacing with a connector 151 that provides actuation signals to motor 150 through cable 152. A number of different configurations of connectors may be utilized consistent with the invention. For example, connector 35 may be configured as a 28 pin MATE-N-LOC connector so that the connector may interface with connector 106 in the spin rinse dryer so that the existing motor therein may be tested. In the alternative, connector 35 may be any alternate design that provides the actuation signals directly to motor 150.

It should also be appreciated that various additional cables and/or adaptors may be utilized to couple test fixture 10 to various alternate connector designs.

Test fixture 10 also includes a plurality of user-actuated switches, including a start switch 40, a stop switch 42 and an N2 supply switch 44. Each of switches 40–44 emulates corresponding switches 144, 146 and 140 respectively provided on the spin rinse dryer. Accordingly, switches 40 and 42 are typically momentary-type switches, while switch 44 is a toggle-type switch to simulate pressure or no-pressure conditions.

Test fixture 10 also includes a plurality of indicators, including a system power lamp indicator 50, a door seal lamp indicator 52, a heater lamp indicator 56, a door seal indicator 54, a rotational stop positioner (RSP) indicator 58, a manifold N2 indicator 60, a process indicator 62, a rinse indicator 64, a heater N2 indicator 66, a heater bowl indicator 68, and an N2 dry indicator 69. Each indicator emulates a corresponding electrically-actuated device on the spin rinse dryer, e.g., lamp 136 for indicator 50, lamp 137 for indicator 52, valve 122 for indicator 54, lamp 138 for indicator 56, valve 126 for indicator 58, valve 128 for indicator 60, valve 124 for indicator 62, valve 120 for indicator 64, element 132 for indicator 66, element 134 for indicator 68 and valve 130 for indicator 69. Any number of indicators, e.g., neon lamps, light-emitting diodes, incandescent lamps, etc., may be used for indicators 50–69.

It should be appreciated that different sets of indicators may be utilized in the alternative, e.g., if it is not desirable to monitor any particular electrically-actuated devices in spin rinse dryer 100. Moreover, it should be appreciated that for other spin rinse dryer configurations, different configurations of switches, indicators, and/or connectors may be required for test fixture 10.

Figure 3:
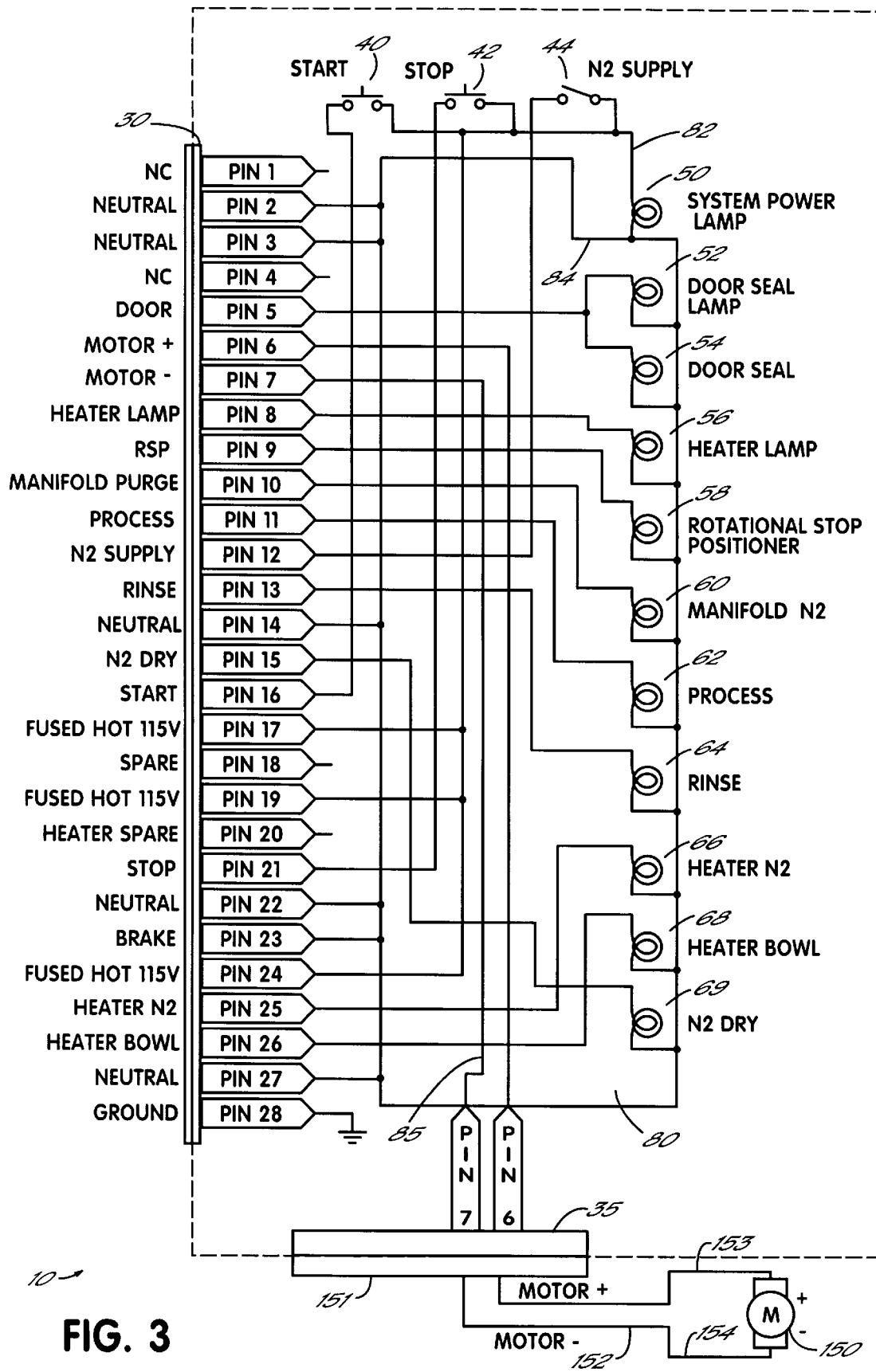
FIG. 3 is an electrical schematic diagram of the test fixture of FIG. 2.

A schematic diagram of test fixture 10 is illustrated in FIG. 3. Specifically, FIG. 3 illustrates a first electrical circuit 80 that interfaces connector 30 with switches 40–44 and indicators 50–69. The 28 pins of connector 30 are interfaced with these devices in such a manner that the actuation signals generated by controller 110 to actuate the various electrically-actuated devices in the spin rinse dryer will activate the corresponding indicator 50–69. Electrical circuit 80 generally includes a power (fused hot 115V) bus 82 driven by pins 17, 19 and 24, and a neutral return bus 84 coupled to pins 2, 3, 14, 22 and 27. Pin 23, which is coupled to the brake signal for controller 110, is also tied to bus 84 to disable this feature during testing. Switches 40, 42 and 44 are respectively coupled between power bus 82 and pins 16, 21 and 12 to generate suitable signals for controlling the cycling of controller 110. Indicator 50 is coupled between buses 82 and 84 such that it is activated whenever power is supplied by controller 110. Indicators 52 and 54 are coupled jointly to pin 5 to receive a DOOR control signal from controller 110. Moreover, indicators 56–69 are respectively coupled to pins 8, 9, 10, 11, 13, 25, 26 and 15 to receive the appropriate actuation signals from controller 110. Each of indicators 50–69 is coupled at its opposite terminal to bus 84 to provide a return path and close the electrical circuits therefor. Pin 28 is also coupled to housing 20 to provide a ground path therefor.

Connector 35 is coupled to a second electrical circuit 85 that interfaces motor 150 with controller 110. Circuit 85 generally couples a pair of motor actuation signals (motor+ and motor-) received from pins 6 and 7 of connector 30. In turn, these signals are passed to corresponding pins 6 and 7 on connector 35 such that the signals may be passed through to motor 150 across a pair of conductors 153 and 154 provided on cable 152. In this manner, motor 150 is driven directly by controller 110 through fixture 10.

A number of enhancements and/or modifications may be made to test fixture 10 consistent with the invention. For example, resistors, inductors and/or capacitors may be associated with the various indicators to better emulate the impedance characteristics of their associated electrically-actuated spin rinse dryer components.

Moreover, a dummy load may be utilized as a replacement for a motor for some testing procedures. The impedance of such a load may be matched with that of a motor, and moreover, a measuring device such as a voltmeter and/or ammeter may be used to monitor the signals supplied to the dummy load.

In addition, a tachometer, whether internal or external to housing 20, may be utilized to monitor the performance of a motor coupled to the test fixture. The tachometer may be coupled to the output shaft of the motor for direct measurement, or may provide an indirect measurement based upon the signals produced to the motor from the test fixture.

Other modifications will be apparent to one of ordinary skill in the art.

Test fixture 10 enables a flexible manner of testing various components on a spin rinse dryer. For example, to test a spin rinse dryer controller, the controller is coupled to the test fixture through connector 30 thereof, and a known operational motor is coupled to test fixture 10 through connector 35. Line current is provided to the controller through its AC plug by inserting the plug into a standard 110 VAC/60 Hz receptacle. The cycle time on the thumb wheel switches of the controller may be set to any suitable time period for testing purposes, such as 30 seconds. In addition, the rpm adjustments for the controller are typically set to minimum values, then ramped-up slowly to the standard speeds for each cycle (typically about 400 RPM for the rinse cycle, about 1800 RPM for the $1^{st}$ dry cycle, and about 600 RPM for the $2^{nd}$ dry cycle).

To initiate testing of the spin rinse dryer controller, the power switch therefor is activated, and as a result, the display thereof should display "9" for 10 to 90 seconds. At this time, the spin rinse dryer controller performs a self-test and initialization cycle. After completion of this cycle, indicators 50, 52 and 54 should be activated.

In addition, after completion of the initialization cycle, a "0" should be displayed on the spin rinse dryer display. At that time, only indicators 50 and 58 should be displayed.

Next, a user may activate the start button 40 to initiate a rinse cycle, whereby the motor should begin to spin at a set rate, which the user typically should be able to ramp up to about 400 rpm. The display on the controller should begin to decrement from the set time by one at one unit per second. During the countdown, indicators 50, 52, 54 and 64 should be activated.

Upon completion of the rinse cycle, the controller should automatically progress to the first dry cycle, during which the motor should spin at a set rate, which the user typically should be able to ramp up to about 1800 rpm. In addition, indicators 50, 52, 54, 56, 66, 68 and 69 should be activated. During this time, the display of the controller should again decrement from the set time by one at one unit per second.

Upon completion of the of the first dry cycle, a second cycle should be initiated, during which the motor should spin at a set rate, which the user typically should be able to ramp up to about 600 rpm, and indicators 50, 52, 54, 56, 66, 68 and 60 should be activated. Again, the display on the controller should decrement from the set time by one at one unit per second.

Upon completion of the second dry cycle, the controller should once again display a "9" for 10 to 90 seconds. During this time, only indicators 50–54 should be activated. Next, the controller should display a "0" indicating completion of the cycle, whereby the process may be repeated if desired.

If any of the above-described activities do not occur in the precise order set forth herein, a failure of the controller is indicated. If, however, all activities occur as described herein, the controller is assumed to operate correctly.

Another test that may be performed is that of activating nitrogen (N2) supply switch 44 to simulate the loss of pressure from the nitrogen supply. In normal operation of the controller, the activation of this switch to an "off" position at any time should result in the controller immediately shutting down and displaying code "3" in the controller display. Otherwise, an error in the controller is indicated.

The above-described procedure is useful for testing a controller both within the technician's shop as well as in the fabrication or chase areas of a production facility. The test fixture may also be used, however, to diagnose a number of components installed in a production spin rinse dryer. For example, if it is unknown specifically which component is not performing according to its specifications, a suitable test procedure may be utilized to identify different problems with the spin rinse dryer. First, the controller of the spin rinse dryer may be decoupled from the production equipment and coupled to connector 30 of test fixture 10. In addition, a known operational motor may be coupled to connector 35, and the controller may be tested as described above to verify its operation.

If the controller fails the procedure, it is assumed that the controller is defective. If, however, the controller passes the procedure, the known operational motor may be decoupled from the test fixture and the test fixture may then be coupled to the existing motor in the spin rinse dryer. A known operational controller may then be coupled to the test fixture through connector 30. Given that the existing controller for the spin rinse dryer may be assumed to be operational, it may be sufficient to utilize this controller for testing the motor. In the alternative, another known operational controller may be coupled to the test fixture if desired.

The above-described test procedure may then be initiated to verify the operation of the motor. If the motor does not operate in accordance with the test procedure parameters outlined above, it may be assumed that the motor is defective and must be replaced.

If, on the other hand, the motor passes the test procedure, it may be assumed that the likely cause of the problem can be found in the cables or other electrical connections within the spin rinse dryer. Accordingly, a technician may then be able to inspect and test such connections in a manner well known in the art.

The above-described test fixture provides a number of unique advantages in terms of testing and diagnosing problems with spin rinse dryer components. First, the test fixture may be mounted in a suitably portable housing, e.g., a housing manufactured from a light-weight ABS or other type of plastic. Moreover, the simplicity of circuits 80 and 85 permit a relatively small, compact housing to be utilized. As a result, the test fixture is easy to transport, and thus, is ideal for use in fabrication or chase areas.

In addition, the ability to removably couple a motor to the test fixture provides added versatility for testing not only a controller, but also a motor and/or the electrical connections in a spin rinse dryer with the same test fixture.

Moreover, through electrical emulation of the various components of the spin rinse dryer, testing of the various components may be performed without cycling the spin rinse dryer through its actual operation. Accordingly, their need for processing materials and chemicals such as deionized water and/or a supply of nitrogen is eliminated by virtue of the test fixture.

In addition, the test fixture is versatile and easily modified to handle modifications or upgrades to spin rinse dryers and any of their components.

Therefore, it should be appreciated by those of skill in the art that the invention provides significant advantages in terms of testing and diagnosing various components of a spin rinse dryer. Various modifications may be made to the above-described embodiments without departing from the spirit and scope of the invention. Therefore, the invention lies solely in the claims hereinafter appended.

What is claimed is:

1. A test fixture for use in testing components in a spin rinse dryer, the spin rinse dryer of the type including a controller coupled to a motor and a plurality of electrically-actuated components through a connector, the controller generating a motor actuation signal that actuates the motor and a plurality of component actuation signals that respectively actuate the electrically-actuated components, the test fixture comprising:

(a) a housing;
    (b) a plurality of indicators mounted on the housing;
    (c) a first connector configured to removably couple with the connector on the controller;
    (d) a first electric circuit coupled between the first connector and the plurality of indicators, the first electric circuit including a plurality of conductors respectively configured to transmit the plurality of component actuation signals from the controller to the plurality of indicators such that the plurality of indicators respectively emulate the plurality of electrically-actuated components;
    (e) a second connector configured to removably couple with a connector on a motor; and
    (f) a second electric circuit coupled between the first connector and the second connector, the second electric circuit including at least one conductor configured to transmit the motor actuation signal between the controller and the motor.

2. The test fixture of claim 1, wherein each of the plurality of indicators includes a neon lamp.

3. The test fixture of claim 1, further comprising a plurality of input switches coupled to the first connector through a third electric circuit, each input switch generating an input signal to the controller.

4. The test fixture of claim 3, wherein the plurality of switches includes a start switch, a stop switch, and a nitrogen supply switch.

5. The test fixture of claim 4, wherein the start and stop switches are momentary switches.

6. The test fixture of claim 1, wherein each of the plurality of indicators emulates an electrically-actuated component selected from the group consisting of a system power lamp, a door seal lamp, a door seal valve, a heater lamp, a rotational stop positioner valve, a manifold nitrogen valve, a process valve, a rinse valve, a heater nitrogen element, a heater bowl element, and a nitrogen dry valve.

7. The test fixture of claim 1, further comprising a known operational motor, the known operational motor including a connector that is electrically and removably coupled to the second connector.

8. A method of testing a spin rinse dryer, the spin rinse dryer of the type including a controller coupled to a motor and a plurality of electrically-actuated components through a connector, the controller generating a motor actuation signal that actuates the motor and a plurality of component actuation signals that respectively actuate the electrically-actuated components, the method comprising:

(a) electrically and removably coupling a controller to a first connector on a test fixture, wherein the test fixture includes a plurality of indicators coupled to the first connector and respectively configured to receive the plurality of component actuation signals from the controller and thereby emulate the plurality of electrically-actuated components;
    (b) electrically and removably coupling a motor to a second connector on the test fixture, wherein the test fixture further includes an electric circuit coupled between the first and second connectors to transmit the motor actuation signal between the controller and the motor;

(c) initiating a control cycle for the controller; and (d) during execution of the control cycle, monitoring the motor and the plurality of indicators to verify proper operation of the controller.

9. The method of claim 8, wherein electrically and removably coupling the controller to the first connector includes electrically coupling the first connector to a controller to be tested, and wherein electrically and removably coupling the motor to the second connector includes electrically coupling the second connector to a known operational motor.

10. The method of claim 9, wherein, during execution of the control cycle, the controller to be tested is installed in the spin rinse dryer.

11. The method of claim 9, further comprising, if the proper operation of the controller to be tested is verified:

(a) decoupling the controller to be tested from the first connector;

(b) electrically and removably coupling a known operational controller to the first connector;

(c) decoupling the known operational motor from the second connector;

(d) electrically and removably coupling a motor to be tested to the second connector;

(e) initiating a second control cycle for the known operational controller; and (f) during execution of the second control cycle, monitoring the motor to be tested to verify proper operation thereof.

12. The method of claim 11, wherein, during execution of the second control cycle, the motor to be tested is installed in the spin rinse dryer.

13. The method of claim 11, wherein the spin rinse dryer further includes at least one cable coupling the controller to be tested to the motor to be tested and the plurality of electrically-actuated components, the method further comprising, if the proper operation of the motor to be tested is verified:

(a) decoupling the known operational controller from the first connector;

(b) electrically and removably coupling the controller to be tested to the first connector;

(e) initiating a third control cycle for the controller to be tested; and (f) during execution of the third control cycle, monitoring the motor to be tested and the plurality of indicators to verify proper operation of the cable.

14. The method of claim 13, wherein, during execution of the third control cycle, the motor to be tested and the controller to be tested are installed in the spin rinse dryer.

15. The method of claim 8, wherein initiating the control cycle includes generating a start signal in response to user activation of an input switch, wherein the input switch is electrically coupled to the controller through the first connector.

16. The method of claim 15, further comprising simulating a supply of nitrogen via a user-actuated switch electrically coupled to the controller through the first connector.

* * * * *

UNITED STATES PATENT AND TRADEMARK OFFICE
CERTIFICATE OF CORRECTION

PATENT NO. : 5,911,785
DATED : June 15, 1999
INVENTOR(S) : Douglas A. Czaja and Robert Bolanos It is certified that error appears in the above-identified patent and that said Letters Patent is hereby corrected as shown below:

Column 4, line 15 reads "MOTOR-acontrol signals" and should read --MOTOR-control signals--.

Signed and Sealed this

Twenty-ninth Day of February, 2000

Attest:

Q. TODD DICKINSON

Attesting Officer

Commissioner of Patents and Trademarks